(12) United States Patent
Yamada et al.

(10) Patent No.: US 12,738,939 B2
(45) Date of Patent: Sep. 15, 2026

(54) INPUT DEVICE

(71) Applicant: Alps Alpine Co., Ltd., Tokyo (JP)

(72) Inventors: Tomoki Yamada, Miyagi-ken (JP); Makoto Abe, Miyagi-ken (JP); Toshiki Nakamura, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 23 days.

(21) Appl. No.: 18/982,522

(22) Filed: Dec. 16, 2024

(65) Prior Publication Data

US 2025/0119140 A1 Apr. 10, 2025

Related U.S. Application Data

(63) Continuation of application No. PCT/JP2023/007512, filed on Mar. 1, 2023.

(30) Foreign Application Priority Data

Jul. 25, 2022 (JP) ................................ 2022-117780

(51) Int. Cl.
*H03K 17/96* (2006.01)
*H05B 45/30* (2020.01)
*H05B 47/115* (2020.01)

(52) U.S. Cl.
CPC ........... *H03K 17/962* (2013.01); *H05B 45/30* (2020.01); *H05B 47/115* (2020.01); *H03K 2217/960735* (2013.01)

(58) Field of Classification Search
None
See application file for complete search history.

(56) References Cited

U.S. PATENT DOCUMENTS 12,159,007 B1 * 12/2024 Huang ................ G06F 3/04182
2004/0238726 A1 12/2004 Caldwell
2012/0249401 A1 * 10/2012 Omoto ................ G09G 3/3233
345/80

FOREIGN PATENT DOCUMENTS

JP 2008-159594 7/2008
JP 4687827 5/2011

OTHER PUBLICATIONS

International Search Report from International Application No. PCT/JP2023/007512 dated May 23, 2023, with English translation.

* cited by examiner

*Primary Examiner* — Kenneth B Wells
(74) *Attorney, Agent, or Firm* — Beyer Law Group LLP

(57) ABSTRACT

An input device includes: a light-emitting diode; a switching element connected in series with the light-emitting diode, the switching element switching the light-emitting diode between the on and off states; an electrostatic sensor having a detection electrode capacitively coupled to a circuit portion disposed between the light-emitting diode and the switching element; and a capacitor having a first terminal connected to the circuit portion and a second terminal connected to a fixed potential point.

5 Claims, 8 Drawing Sheets

FIG. 2

CAPACITANCE (pF) OF DETECTION ELECTRODE 111
40
38
36
34
32
30
28
26
24
22
20
1
10
100
1000
10000
100000
Cx (pF)
Cd2
Cd1
Ct1 (ON/WITHOUT MANIPULATION)
Ct1 (ON/WITH MANIPULATION)
Ct2 (OFF/WITHOUT MANIPULATION)
Ct2 (OFF/WITH MANIPULATION)

100M
103
130
161
160
162
Cx
GND
R
105
150
LIGHT EMISSION CONTROL UNIT
140
GND
Cld
Cls
Clg
GND
112, 110M
Cds
101
111, 110M
116, 110M
GND
115, 110M
GND
Cf
FT
GND

INPUT DEVICE

CLAIM OF PRIORITY

This application is a Continuation of International Application No. PCT/JP2023/007512 filed on Mar. 1, 2023, which claims benefit of Japanese Patent Application No. 2022-117780 filed on Jul. 25, 2022. The entire contents of each application noted above are hereby incorporated by reference.

BACKGROUND OF THE INVENTION

1. Field of the Invention

The present invention relates to an input device.

2. Description of the Related Art

A conventional light-emitting diode (LED) lighting device is composed of a power supply unit having at least a pair of alternating-current input terminals and a pair of direct-current output terminals, and an LED unit, which has a circuit of LEDs to which direct currents are supplied through a pair of power-supply lines connected to the direct-current output terminals of the power supply unit and also has a conductive portion electrostatically coupled to the LEDs through dielectric bodies. The power supply unit has a DC-DC converter circuit. A secondary-side ground or primary-side ground of the DC-DC converter circuit is connected to the conductive portion in the LED unit through a first capacitor. A capacitance set for the first capacitor is larger than a stray capacitance formed between the conductive portion and the LED in the LED unit (see Japanese Unexamined Patent Application Publication No. 2010-245570, which is issued as Japanese Patent No. 4687827, for example).

The detection capacitance of an electrostatic sensor may differ depending on whether a light-emitting diode is turned on or off. In this case, the detection capacitance of the electrostatic sensor varies depending on the light emission state of the light-emitting diode.

SUMMARY OF THE INVENTION

In view of the above situation, the present invention provides an input device in which the influence of the light emission state of a light-emitting diode on the detection capacitance of an electrostatic sensor is suppressed.

An input device in an embodiment of the present disclosure includes: a light-emitting diode; a switching element connected in series with the light-emitting diode, the switching element switching the light-emitting diode between the on and off states; an electrostatic sensor having a detection electrode capacitively coupled to a circuit portion disposed between the light-emitting diode and the switching element; and a capacitor having a first terminal connected to the circuit portion and a second terminal connected to a fixed potential point.

It is possible to provide an input device in which the influence of the light emission state of a light-emitting diode on the detection capacitance of an electrostatic sensor is suppressed.

BRIEF DESCRIPTION OF THE DRAWINGS

FIG. 2 illustrates an example of an equivalent circuit model used in a simulation for the detection capacitance of an electrostatic sensor in the input device;

DESCRIPTION OF THE PREFERRED EMBODIMENTS

An embodiment to which an input device in the present disclosure is applied will be described below.

Embodiment

<Structure of Input Device 100>

Figure 1:
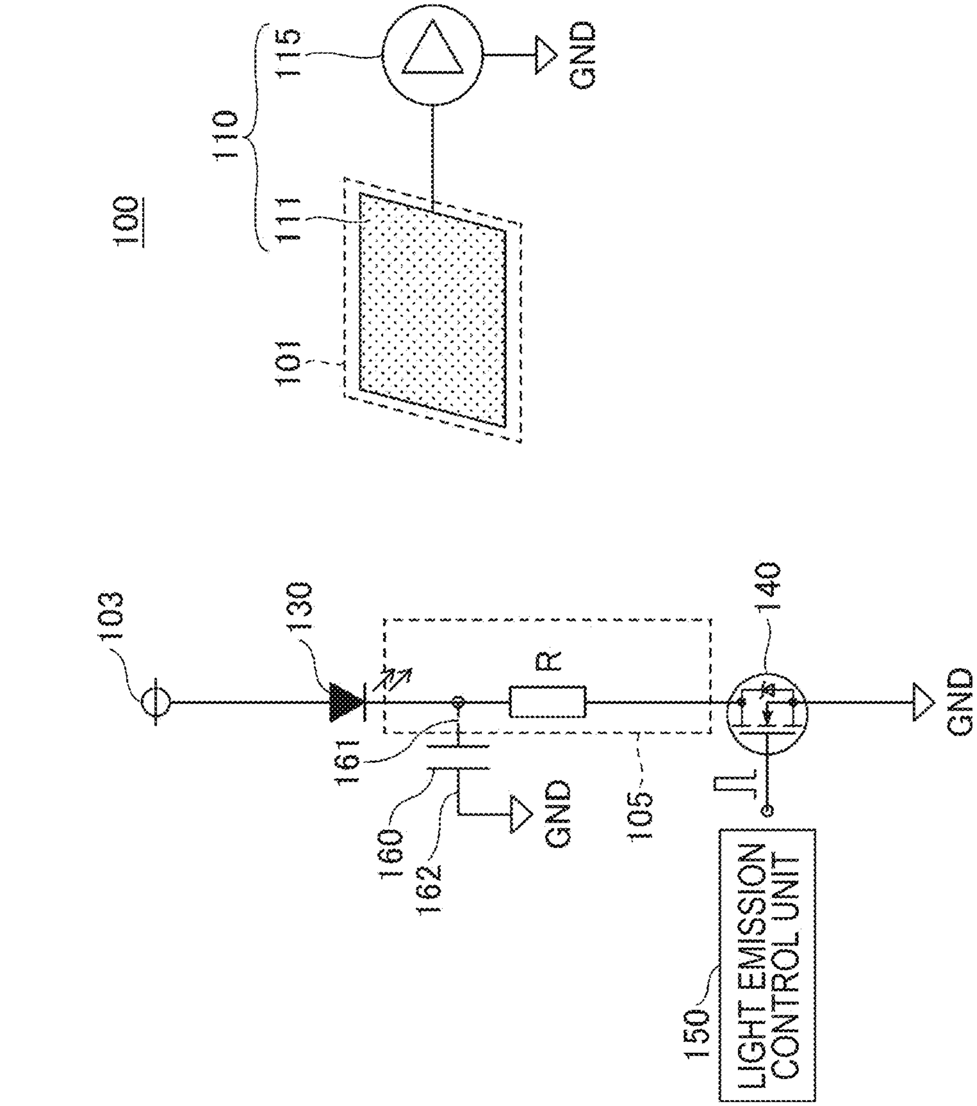
FIG. 1 illustrates an example of the structure of an input device.

FIG. 1 illustrates an example of the structure of an input device 100. The input device 100 includes a manipulation surface 101, an electrostatic sensor 110, a light-emitting diode (LED) 130, a metal oxide semiconductor field-effect transistor (MOSFET) 140, a light emission control unit 150, and a capacitor 160. The input device 100 also includes a circuit portion 105.

On the input device 100, an input manipulation can be performed by manipulating the manipulation surface 101 with an object including a fingertip. The LED 130 illuminates the manipulation surface 101 as an example. For example, symbols representing marks, characters, and the like eligible for manipulation may be provided on the manipulation surface 101. In this case, a translucent portion having the shape of the symbol may be provided on the manipulation surface 101 and the symbol may be illuminated by the LED 130 from the same side as the rear surface of the manipulation surface 101.

The input device 100 of this type may be disposed in, for example, a manipulation unit of an audio device, a navigation system, an air conditioner, or the like provided in the interior of a vehicle and mounted in the vehicle. In this case, the input device 100 can be attached to a steering wheel, a center console, or the like. Alternatively, the input device 100 may be an input unit of a tablet computer, a smart phone, a game machine, or the like used by an individual. Alternatively, the input device 100 may be, for example, an input unit of a tablet-type input device or automatic teller machine (ATM), which is placed in a store, a facility, or the like and is used by an indefinite number of users.

The electrostatic sensor 110 has a detection electrode 111 and a detection unit 115. The manipulation surface 101 is disposed so as to be overlaid on the detection electrode 111. The electrostatic sensor 110 is part of the input device 100 or part of a surface of a case, a cover, or the like of a device that includes the input device 100. The user performs a manipulation for the detection electrode 111 from above the manipulation surface 101.

Although only one detection electrode 111 is illustrated in FIG. 1, the electrostatic sensor 110 may have a plurality of detection electrodes 111. The detection electrode 111 can be manufactured from a conductor such as a metal or an indium tin oxide (ITO) material. The detection electrode 111 is an electrode manufactured from a single conductor. In the description below, to simplify explanation, it will be assumed that only one detection electrodes 111 is provided and that a manipulation for the detection electrode 111 is synonymous with a manipulation for the electrostatic sensor 110.

The electrostatic sensor 110 is a capacitive sensor provided to detect a proximity, a contact, or the like of an object including a fingertip for the manipulation surface 101 according to a change in the capacitance of the detection electrode 111. The electrostatic sensor 110 detects an object including a fingertip in a self-capacitance method. The detection unit 115 is connected to the detection electrode 111.

A manipulation in which a fingertip or the like comes into contact with the manipulation surface 101 is a touch (contact) manipulation. A manipulation in which a fingertip or the like approaches the manipulation surface 101 in a state in which the fingertip or the like does not come into contact with the manipulation surface 101 (that is, a non-contact state) is a hover manipulation. A proximity of a fingertip or the like to the manipulation surface 101 means that the fingertip or the like approaches the manipulation surface 101 to the extent that a change detectable by the input device 100 occurs in the capacitance of the electrostatic sensor 110.

The detection unit 115 detects the capacitance of the detection electrode 111 in the electrostatic sensor 110 and outputs detection data representing the capacitance. The detection unit 115 digitally converts the capacitance (analog value) of the detection electrode 111, the capacitance being entered from the detection electrode 111, and outputs detection data representing the capacitance in digital form. Although not described here, a computer or microcomputer is connected to the output side of the detection unit 115 to make a decision about a proximity or contact of a fingertip or the like for the manipulation surface 101 according to the output of the detection unit 115.

Although details are omitted here, when the electrostatic sensor 110 has a plurality of detection electrodes 111, the detection unit 115 may have a function as a selection unit that applies voltages to the plurality of detection electrodes 111 to select them in a time-division manner. When the plurality of detection electrodes 111 is arranged in the X direction and Y direction, the detection unit 115 may have a function as a selection unit that applies voltages used to select the plurality of detection electrodes 111 in a time-division manner in the X direction and Y direction.

The LED 130 has an anode connected to a power supply 103 as well as a cathode connected to the drain of the MOSFET 140 through the circuit portion 105. Electric power from the power supply 103 is supplied from a device or the like that includes the input device 100. The switching of the LED 130 between the on and off states is performed by the MOSFET 140. The LED 130 illuminates the manipulation surface 101 as described above, as an example.

The MOSFET 140 has a drain connected to the cathode of the LED 130 through the circuit portion 105, a source connected to ground (GND), and a gate connected to the light emission control unit 150. Ground is an example of a fixed potential point. Between the power supply 103 and ground, a path between the drain and source of the MOSFET 140 is connected in series with the LED 130. The inverted triangle in FIG. 1 represents, for example, ground (earth). The source of the MOSFET 140 may be connected to a point with a fixed potential other than 0 V, instead of ground represented by the inverted triangle in FIG. 1.

When the MOSFET 140 is turned on and a current flows between the drain and the source, a current flows from the power supply 103 into the LED 130, turning on the LED 130 (causing it to emit light). When the MOSFET 140 is turned off and a current does not flow between the drain and the source, a current does not flow from the power supply 103 into the LED 130, turning off the LED 130 (the light goes off).

The light emission control unit 150 outputs a pulse signal to the gate of the MOSFET 140, as an example, to control the driving of the MOSFET 140. Due to control by the light emission control unit 150 for the driving of the MOSFET 140, light emission by the LED 130 is controlled. The light emission control unit 150 is composed of, for example, a pulse generator that generates pulse signals and a microcomputer that controls the pulse generator.

The circuit portion 105, which is a circuit portion between the cathode of the LED 130 and the drain of the MOSFET 140, includes a resistor R. The resistor R restricts a current flowing in the LED 130. The circuit portion 105 is part of a wire used to supply a current to the LED 130. The circuit portion 105 passes by the detection electrode 111. Thus, the circuit portion 105 and detection electrode 111 are capacitively coupled together. Capacitive coupling between the circuit portion 105 and the detection electrode 111 means that as for the detection electrode 111 used to detect a capacitance between the detection electrode 111 and an object including a fingertip in a self-capacitance method, a capacitance is present between the detection electrode 111 and the circuit portion 105 to the extent that the capacitance is not negligible.

The capacitor 160 has a first terminal 161 connected to the circuit portion 105 and a second terminal 162 connected to the fixed potential point. The first terminal 161 is connected to the electrode on the right side, in FIG. 1, of the capacitor 160. The second terminal 162 is connected to the electrode on the left side, in FIG. 1, of the capacitor 160. The first terminal 161 is further connected to the circuit portion 105. Specifically, the first terminal 161 is connected to the cathode of the LED 130 through the circuit portion 105. The second terminal 162 is further connected to ground (GND). Next, the reason why the capacitor 160 is provided will be described.

<Impedance of Circuit Portion 105>

The impedance of the circuit portion 105 will be described here by using the input device 100 in the embodiment and a comparative input device. The comparative input device has a structure in which the capacitor 160 is eliminated from the input device 100 in the embodiment. That is, in the comparative input device, the capacitor 160 is not connected to the circuit portion 105.

In the comparative input device, when the MOSFET 140 is turned on, the LED 130 is turned on; and when the MOSFET 140 is turned off, the LED 130 is turned off. When the MOSFET 140 and LED 130 are turned on, the circuit portion 105 is connected to ground through the path between the drain and source of the MOSFET 140. However, when the MOSFET 140 and LED 130 are turned off, the circuit portion 105 has a floating potential. Therefore, it is considered that the impedance of the circuit portion 105 is low when the LED 130 is turned on, and is high when the LED 130 is turned off. That is, it is considered that the impedance of the circuit portion 105 connected to the cathode of the LED 130 varies depending on whether the LED 130 is turned on or off, its on and off states accompanying the on and off states of the MOSFET 140.

In the input device 100 in the embodiment, when the MOSFET 140 is turned on, the LED 130 is turned on. At that time, the circuit portion 105 is connected to ground through the path between the drain and source of the MOSFET 140, so the impedance is low.

When the MOSFET 140 is turned off, however, the LED 130 is turned off. At that time, the circuit portion 105 is not connected to ground through the path between the drain and source of the MOSFET 140. However, even when the LED 130 is turned off, the circuit portion 105 is coupled to ground with a sufficiently large capacitance through the capacitor 160, so the circuit portion 105 does not have a floating capacitance from the viewpoint of an alternating current. Therefore, it is considered that the impedance of the circuit portion 105 is about as low as when the LED 130 is turned off.

From the above, with the input device 100, in the embodiment, which includes the capacitor 160, it is considered that the impedance of the circuit portion 105 connected to the cathode of the LED 130 is substantially the same between when the LED 130 is turned on and when the LED 130 is turned off.

As described above, when the capacitor 160 is connected to the circuit portion 105, it is possible to suppress a difference between the impedance of the circuit portion 105 when the LED 130 is turned on and the impedance of the circuit portion 105 when the LED 130 is turned off, so the input device 100 uses the capacitor 160. The influence of the difference in impedance on the detection capacity will be described in a simulation below.

<Simulation>

Figure 2:
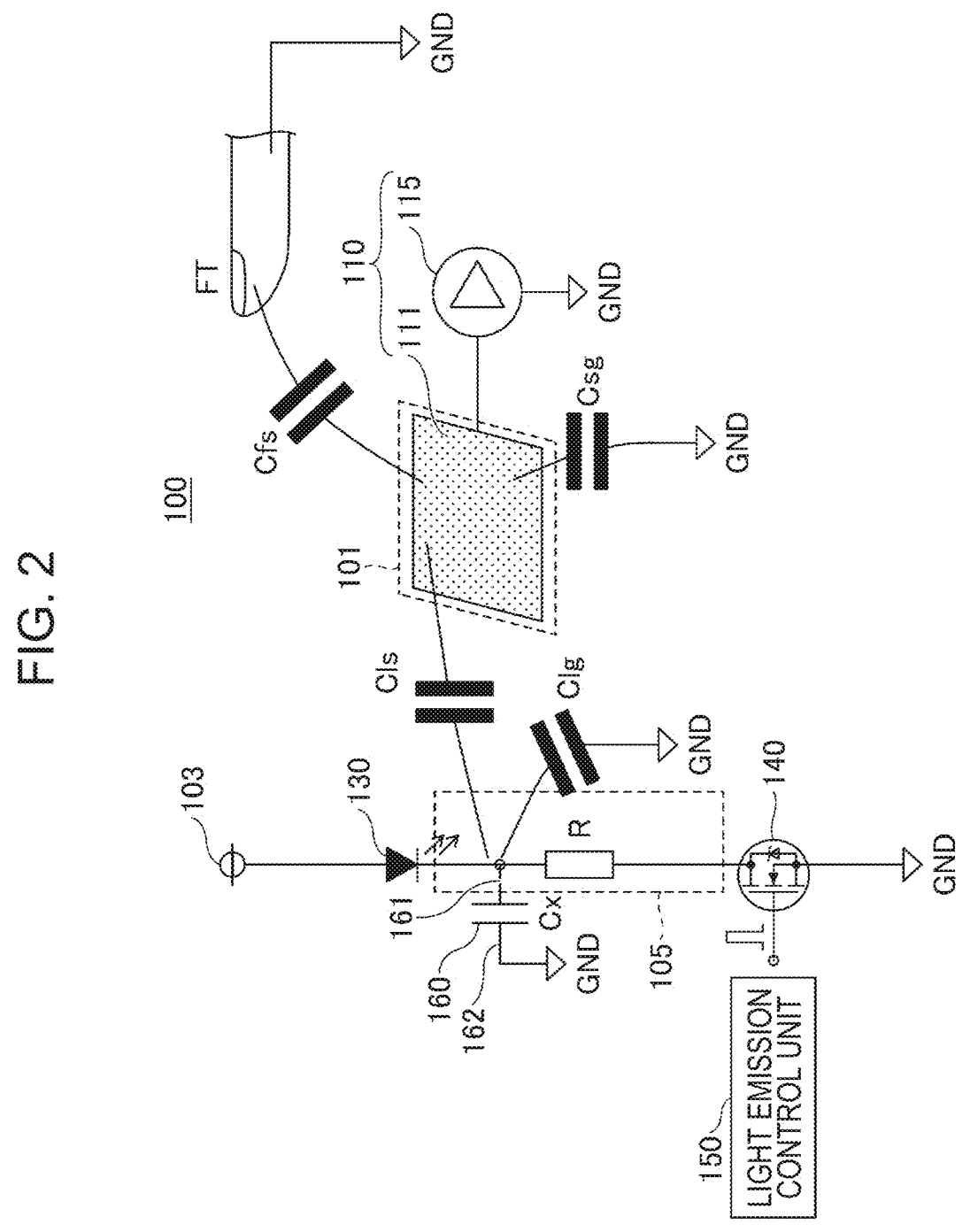

FIG. 2 illustrates an example of an equivalent circuit model used in a simulation for the detection capacitance of the electrostatic sensor 110 in the input device 100. Here, an equivalent circuit used when the user manipulates the input device 100 with a fingertip FT will be described.

Since the surface area of the body of the user is large, the body is coupled to environmental ground with a sufficiently large capacitance. Form the viewpoint of capacitance detection, it is safe to consider that the fingertip FT, which is part of the body of the user, is connected to ground through the body of the user. Therefore, when the input device 100 is manipulated with the fingertip FT, a parasitic capacitance Cfs is generated between the fingertip FT and the detection electrode 111. The parasitic capacitance Cfs is increased as the fingertip FT approaches the detection electrode 111.

It can also be considered that there is a parasitic capacitance Csg between the detection electrode 111 and ground, there is a parasitic capacitance Cls between the detection electrode 111 and the circuit portion 105, and there is a parasitic capacitance Clg between the circuit portion 105 and ground. Therefore, the equivalent circuit in FIG. 2 is an equivalent circuit in which the parasitic capacitances Cfs, Csg, Cls, and Clg are added to the structure in FIG. 1. In FIG. 2, the capacitance of the capacitor 160 is denoted Cx for simulation purposes. Since the input device 100 in the embodiment includes the capacitor 160 but the comparative input device lacks the capacitor 160, Cx=0 (in pF) holds for the comparative input device.

As a condition for the simulation, assuming that when the LED 130 is turned on, the resistance is 0Ω and that when the LED 130 is turned off, there is an open (open state), the capacitor 160 is handled as a 0-pF capacitor. It is also assumed that the resistance of the resistor R in the circuit portion 105 is small enough to be negligible.

As indicated in the equivalent circuit model of this type, which is used in simulation, the input device 100 in the embodiment includes the capacitor 160 connected between ground and the cathode of the LED 130. However, the comparative input device lacks the capacitor 160. Therefore, ahead of the parasitic capacitance Cls, the parasitic capacitance Clg between the circuit portion 105 and ground is connected to the detection electrode 111 through the parasitic capacitance Cls between the detection electrode 111 and the circuit portion 105, in addition to the parasitic capacitance Cfs between the detection electrode 111 and the fingertip FT and the parasitic capacitance Csg between the detection electrode 111 and ground. This is because the electrostatic sensor 110 and LED 130 are placed close to each other and the parasitic capacitance Cls is thereby generated between the detection electrode 111 and the circuit portion 105.

With the comparative input device, when the LED 130 is turned on, the MOSFET 140 is turned on, so the circuit portion 105 is connected to ground through the path between the drain and source of the MOSFET 140. When the LED 130 is turned off, the MOSFET 140 is turned off. With the comparative input device, therefore, the parasitic capacitance Clg is generated between the circuit portion 105 and ground. It is considered that a difference of this type in the capacitance of the circuit portion 105 between the on and off states of the LED 130 causes a variation in the detection capacitance of the electrostatic sensor 110 in the comparative input device.

In contrast to this, since the input device 100 in the embodiment includes the capacitor 160 connected between ground and the cathode of the LED 130, it can be considered that a variation in the capacitance of the detection electrode 111 between the on and off states of the LED 130 is mitigated.

From considerations as described above, the capacitance of the detection electrode 111 can be represented as in an equation below.

With the input device 100 in the embodiment, if the circuit portion 105 is considered to have a sufficiently low impedance, a capacitance Ct1 (combined capacitance) of the detection electrode 111 with the LED 130 turned on can be calculated from equation (1) below.

$$Ct1 = Cfs + Csg + Cls \tag{1}$$

With the comparative input device as well, if the circuit portion 105 is considered to have a sufficiently low impedance, a capacitance Ct (combined capacitance) of the detection electrode 111 with the LED 130 turned on can be calculated from equation (1) above, as with the input device 100 in the embodiment.

With the input device 100 in the embodiment, a capacitance Ct2 (combined capacitance) of the detection electrode 111 with the LED 130 turned off can be calculated from equation (2) below with consideration given to the parasitic capacitance Clg and the capacitance Cx of the capacitor 160.

$$Cts = Cfs + Csg + Cls \times (Clg + Cx)/(Cls + Clg + Cx) \tag{2}$$

Since the comparative input device lacks the capacitor 160, with the comparative input device, a capacitance Ct3 (combined capacitance) of the detection electrode 111 with the LED 130 turned off can be calculated from equation (3) below in which Cx is set to 0 pF in equation (2).

$$Ct3 = Cfs + Csg + Cls \times Clg/(Cls + Clg) \quad (3)$$

As described above, with the input device 100 in the embodiment, the capacitance Ct1 of the detection electrode 111 with the LED 130 turned on can be represented as in equation (1). With the comparative input device as well, the capacitance Ct of the detection electrode 111 with the LED 130 turned on can be similarly represented as in equation (1).

There is a difference by an amount equal to the capacitance Cx of the capacitor 160 between the capacitance Ct2 (see equation (2)) of the detection electrode 111 with the LED 130 turned off in the input device 100 in the embodiment and the capacitance Ct3 (see equation (3)) of the detection electrode 111 with the LED 130 turned off in the comparative input device.

<Simulation Results Using Equation (2)>

Figure 3:
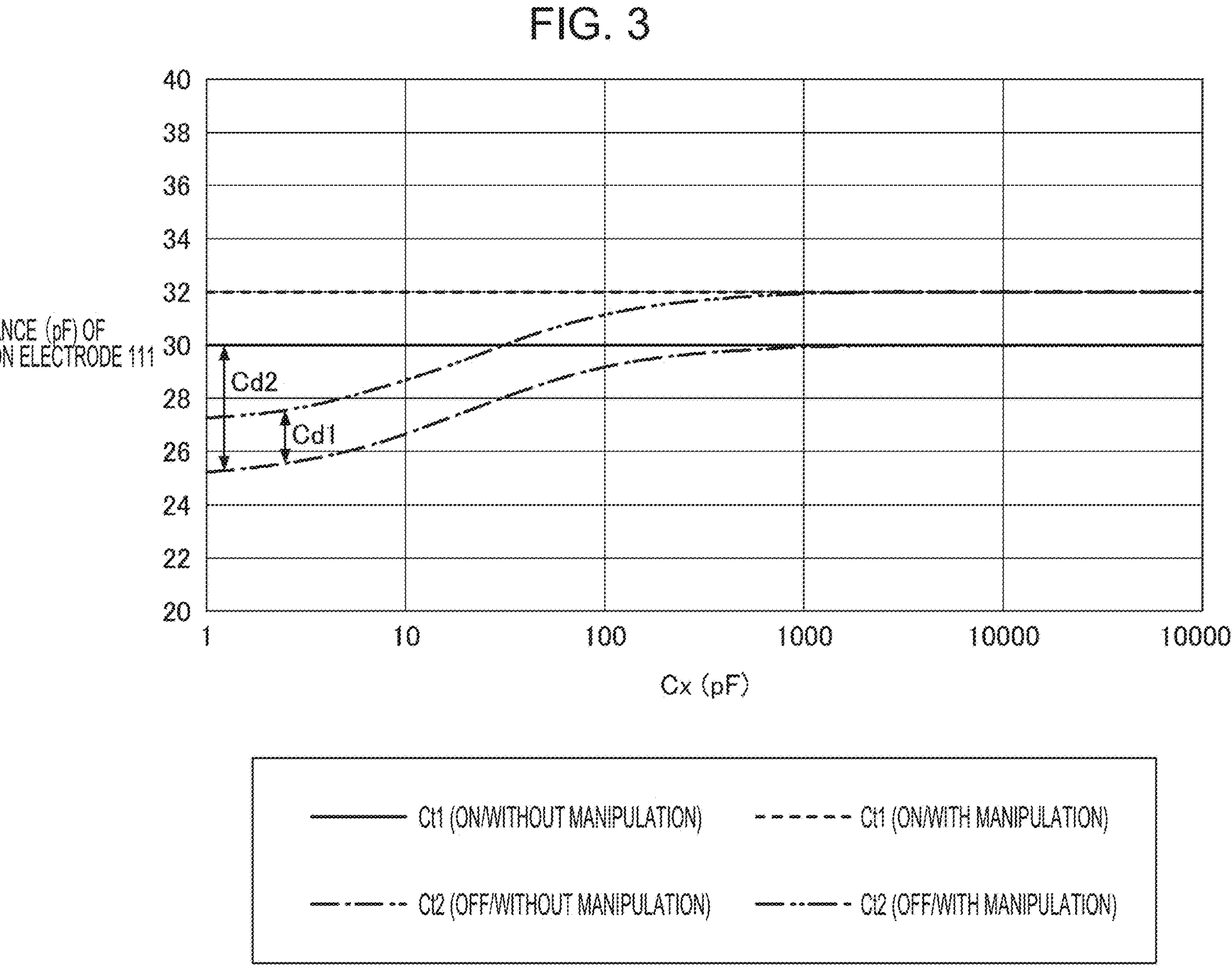
FIG. 3 illustrates calculation results for the capacitances of a detection electrode when the capacitance of a capacitor was changed in the input device in an embodiment.

FIG. 3 illustrates calculation results for the capacitances Ct1 and Ct2 of the detection electrode 111 when the capacitance Cx of the capacitor 160 was changed in the input device 100 in the embodiment. In FIG. 3, the horizontal axis logarithmically represents the capacitance Cx (in pF) of the capacitor 160 and the vertical axis represents the capacitance Ct1 or Ct2 (in pF) of the detection electrode 111. Although the capacitance of the detection electrode 111 in the comparative input device becomes a value with the capacitance Cx set to 0 pF, the value is not indicated here because the capacitance Cx on the horizontal axis is logarithmically represented.

In the simulation, the parasitic capacitance Cfs between the fingertip FT and the detection electrode 111 with the fingertip FT in contact with the manipulation surface 101 was set to 2 pF; the parasitic capacitance Cfs between the fingertip FT and the detection electrode 111 with no manipulation being performed with the fingertip FT was set to 0 pF; the parasitic capacitance Csg between the detection electrode 111 and ground was set to 20 pF; the parasitic capacitance Cls between the detection electrode 111 and the circuit portion 105 was set to 10 pF; and the parasitic capacitance Clg between the circuit portion 105 and ground was set to 10 pF.

In FIG. 3, in which the LED 130 was turned on, the solid line indicates the capacitance Ct1 (ON/without a manipulation) of the detection electrode 111 with no manipulation being performed with the fingertip FT; and the dashed line indicates the capacitance Ct1 (ON/with a manipulation) of the detection electrode 111 with the fingertip FT in contact with the manipulation surface 101. With the LED 130 turned off, the dash-dot line indicates the capacitance Ct2 (OFF/without a manipulation) of the detection electrode 111 with no manipulation being performed with the fingertip FT: and the dash-dot-dot line indicates the capacitance Ct2 (OFF/with a manipulation) of the detection electrode 111 with the fingertip FT in contact with the manipulation surface 101.

As illustrated in FIG. 3, when the capacitance Ct1 (ON/without a manipulation) and the capacitance Ct1 (ON/with a manipulation) were compared with each other, the capacitance Ct1 (ON/with a manipulation) was increased by an amount equivalent to the parasitic capacitance Cfs between the fingertip FT and the detection electrode 111. Similarly, when the capacitance Ct2 (OFF/without a manipulation) and the capacitance Ct2 (OFF/with a manipulation) were compared with each other, the capacitance Ct2 (OFF/with a manipulation) was increased by an amount (Cd1) equivalent to the parasitic capacitance Cfs between the fingertip FT and the detection electrode 111.

When the capacitance Ct1 (ON/without a manipulation) and the capacitance Ct2 (OFF/without a manipulation) were compared with each other, the tendency was found that as the capacitance Cx of the capacitor 160 was increased, the difference between the capacitance Ct1 (ON/without a manipulation) and the capacitance Ct2 (OFF/without a manipulation) was reduced. In particular, when the capacitance Cx of the capacitor 160 became 500 pF or more, the capacitance Ct1 (ON/without a manipulation) and capacitance Ct2 (OFF/without a manipulation) became substantially the same. This represents that in a state in which a manipulation with the fingertip FT is not performed, no variation occurs in the capacitance of the detection electrode 111 between the on and off states of the LED 130. When the capacitance Cx of the capacitor 160 has a very small value such as 1 pF, the difference Cd2 between the capacitance Ct1 (ON/without a manipulation) and the capacitance Ct2 (OFF/without a manipulation) is the difference in the capacitance of the detection electrode 111 between the on and off states of the LED 130.

When the capacitance Ct1 (ON/with a manipulation) and the capacitance Ct2 (OFF/with a manipulation) were compared with each other, the tendency was found that as the capacitance Cx of the capacitor 160 was increased, the difference between the capacitance Ct1 (ON/with a manipulation) and the capacitance Ct2 (OFF/with a manipulation) was reduced. In particular, when the capacitance Cx of the capacitor 160 became 500 pF or more, the capacitance Ct1 (ON/with a manipulation) and capacitance Ct2 (OFF/with a manipulation) became substantially the same. This represents that in a state in which the fingertip FT is in contact with the manipulation surface 101, no variation occurs in the capacitance of the detection electrode 111 between the on and off states of the LED 130. When the capacitance Cx is 500 pF, it is equivalent to 50 times the parasitic capacitance Cls (10 pF) between the detection electrode 111 and the circuit portion 105.

As described above, a variation in the capacitance of the detection electrode 111 between the on and off states of the LED 130 is suppressed both in a state in which a manipulation with the fingertip FT is not performed and in a state in which the fingertip FT is in contact with the manipulation surface 101. Therefore, it is considered that the same is similarly true even when a hover manipulation, in which the fingertip FT is not in contact with the manipulation surface 101, is performed.

<Effects>

The input device 100 includes: the LED 130; the MOSFET 140 connected in series with the LED 130, the MOSFET 140 switching the LED 130 between the on and off states; the electrostatic sensor 110 having the detection electrode 111 capacitively coupled to the circuit portion 105 disposed between the LED 130 and the MOSFET 140; and the capacitor 160 having the first terminal 161 connected to the circuit portion 105 and the second terminal 162 connected to ground. When the capacitor 160 is connected between ground and the cathode of the LED 130, it is possible to suppress a variation in the capacitance of the detection electrode 111 between the on and off states of the LED 130.

Therefore, it is possible to provide the input device 100 in which the influence of the light emission state of the LED 130 on the detection capacity of the electrostatic sensor 110 is suppressed.

Since the MOSFET 140 is used as a switching element, highly reliable switching is achieved in the current path of the LED 130.

Since the capacitance Cx of the capacitor 160 may be 50 times or more of the parasitic capacitance Cls between the detection electrode 111 and the circuit portion 105, no variation occurs in the capacitance of the detection electrode 111 between the on and off states of the LED 130, so substantially the same capacity is obtained between them. Thus, it is possible to provide the input device 100 in which the influence of the light emission state of the LED 130 on the detection capacity of the electrostatic sensor 110 is more effectively suppressed.

<Variation of Circuit Portion 105>

Figure 4A:
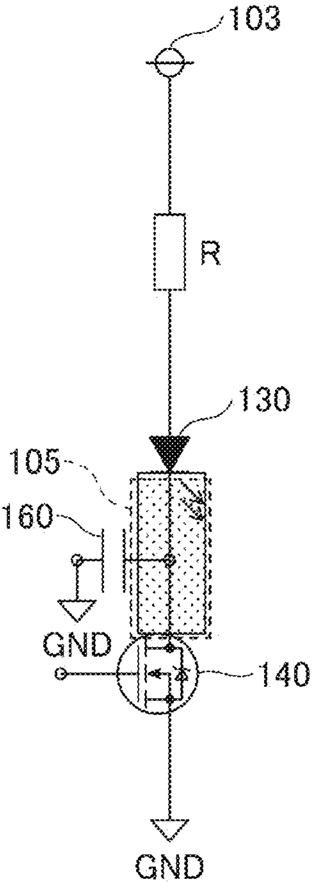
FIG. 4A explains a variation of a circuit portion.
Figure 4B:
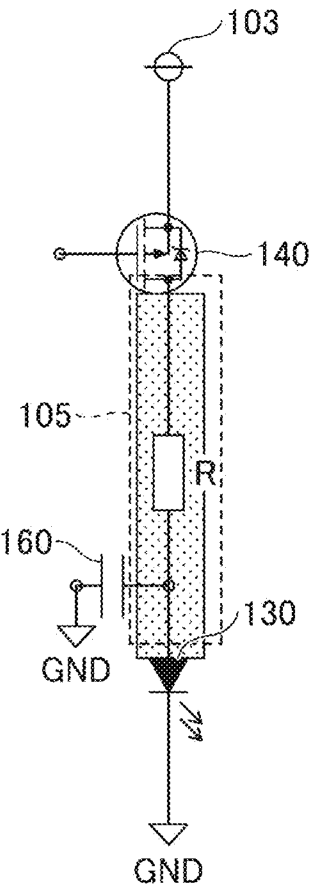
FIG. 4B explains another variation of the circuit portion.
Figure 4C:
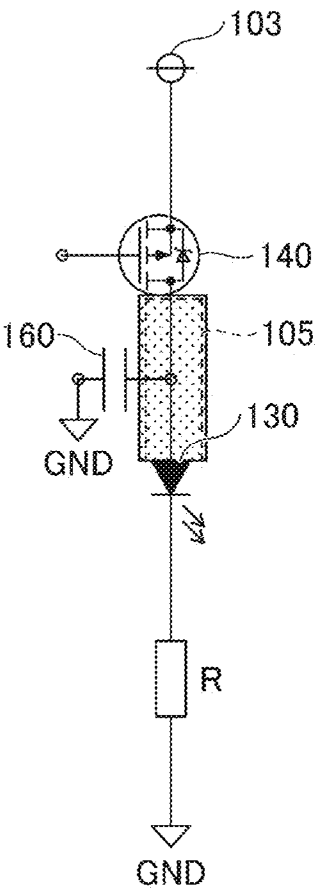
FIG. 4C explains yet another variation of the circuit portion.

FIGS. 4A to 4C explain variations of the circuit portion 105. In FIGS. 4A to 4C, variations of the connections among the LED 130, MOSFET 140, and circuit portion 105, which are disposed between the power supply 103 and ground in FIG. 1, and variations of the connection of the capacitor 160 are illustrated. In FIGS. 4A to 4C, the light emission control unit 150 is omitted.

In FIG. 4A, the order of the LED 130 and resistor R is reversed unlike in FIG. 1. As an example, in FIG. 4A, the placement of the resistor R, which restricts a current, is changed with respect to FIG. 1.

In FIG. 4A, between the power supply 103 and ground, the anode of the LED 130 may be connected to the power supply 103; the cathode of the LED 130 may be connected to the MOSFET 140 through the circuit portion 105; and the capacitor 160 may be connected to the cathode of the LED 130 through the circuit portion 105.

In FIG. 4A, the interval between the power supply 103 and the LED 130 is longer and the interval between the LED 130 and the MOSFET 140 is shorter, when compared with FIG. 1. In FIG. 4A, the resistor R may be a wire resistor. In FIG. 4A, since the interval between the LED 130 and the MOSFET 140 is short, the resistor R is not placed in the circuit portion 105 between the LED 130 and the MOSFET 140. Even in a circuit structure as illustrated in FIG. 4A, when the capacitor 160 is connected between the circuit portion 105 and ground, it is possible to suppress a variation in the capacitance of the detection electrode 111 between the on and off states of the LED 130, as with the input device 100 having the circuit structure illustrated in FIG. 1.

In FIG. 4B, the order of the LED 130 and MOSFET 140 is reversed unlike in FIG. 1. In FIG. 4B, the circuit portion 105 is present between the MOSFET 140 on the same side as the power supply 103 and the LED 130 on the same side as ground. Specifically, in FIG. 4B, between the power supply 103 and ground, the MOSFET 140 may be connected to the power supply 103; the anode of the LED 130 may be connected to the MOSFET 140 through the circuit portion 105; the cathode of the LED 130 may be connected to ground; and the capacitor 160 may be connected to the anode of the LED 130 through the circuit portion 105. When the capacitor 160 is connected between the circuit portion 105 and ground in this way, it is possible to suppress a variation in the capacitance of the detection electrode 111 between the on and off states of the LED 130, as with the input device 100 having the circuit structure illustrated in FIG. 1.

In FIG. 4C, the order of the LED 130 and resistor R is reversed unlike in FIG. 4B. As an example, in FIG. 4C, the placement of the resistor R, which restricts a current, is changed when compared with FIG. 4B. In FIG. 4C, the interval between the LED 130 and ground is longer and the interval between the LED 130 and the MOSFET 140 is shorter, when compared with FIG. 4B. In FIG. 4C, the resistor R may be a wire resistor. In FIG. 4C, since the interval between the LED 130 and the MOSFET 140 is short, the resistor R is not placed in the circuit portion 105 between the LED 130 and the MOSFET 140. Even in a circuit structure as illustrated in FIG. 4C, when the capacitor 160 is connected between the circuit portion 105 and ground, it is possible to suppress a variation in the capacitance of the detection electrode 111 between the on and off states of the LED 130, as with the input device 100 having the circuit structure illustrated in FIG. 1.

<Input Device 100M of Mutual Capacitance Type>

Figure 5:
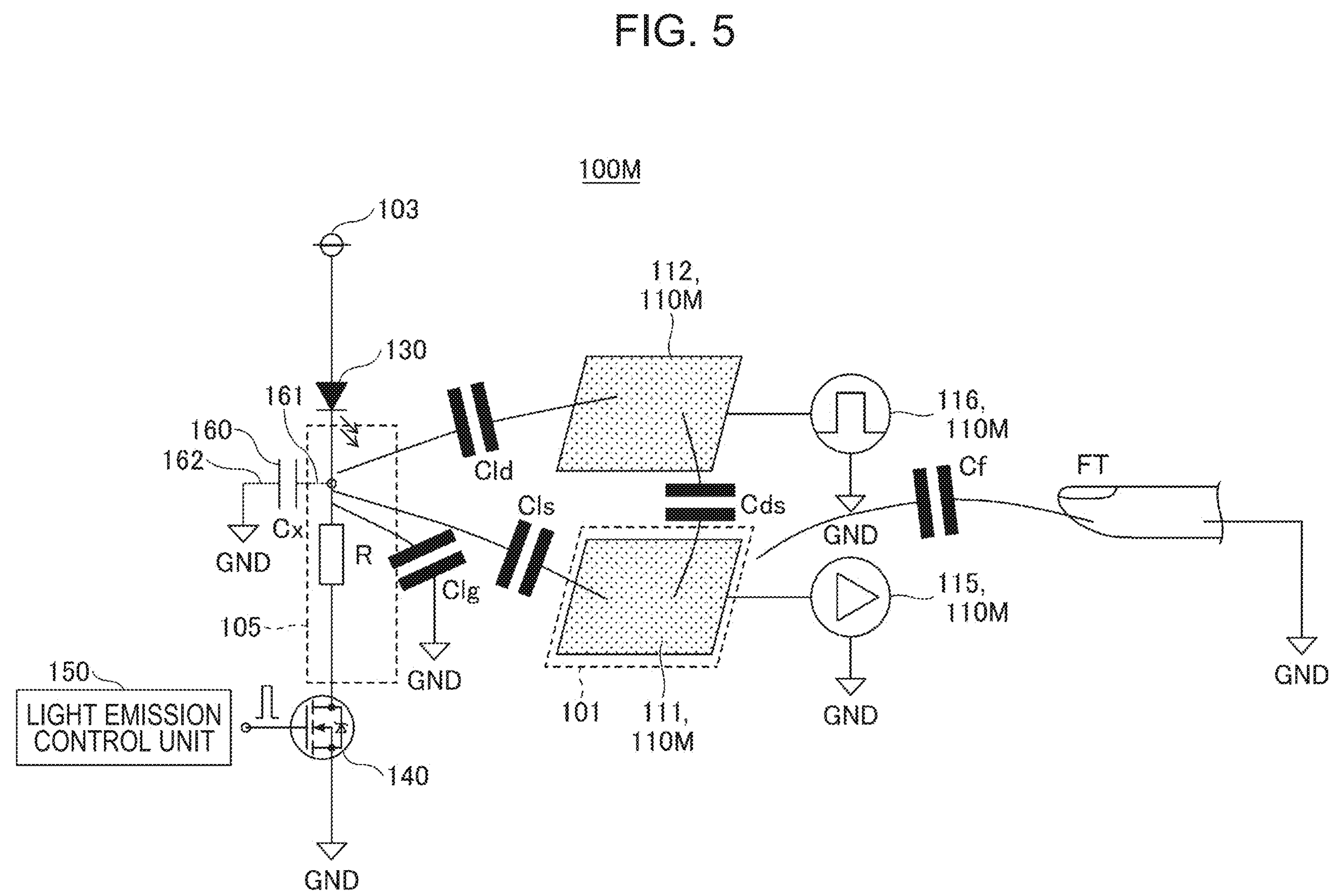
FIG. 5 illustrates an example of an equivalent circuit model used in a simulation for the detection capacitance of an input device, which is a modification of the embodiment.

FIG. 5 illustrates an example of an equivalent circuit model used in a simulation for the detection capacitance of an input device 100M, which is a modification of the embodiment. Here, an equivalent circuit when the user manipulates the input device 100M with the fingertip FT will be described. The input device 100M differs from the input device 100 indicated in FIGS. 1 and 2 in that a capacitance is detected in a mutual capacitance method.

The input device 100M includes an electrostatic sensor 110M instead of the electrostatic sensor 110 in the input device 100 indicated in FIGS. 1 and 2. The electrostatic sensor 110M, which has the detection electrode 111, a driving electrode 112, the detection unit 115, and a mutual-capacitance driving unit 116, is of a mutual capacitance type that detects the capacitance of the detection electrode 111 with respect to the driving electrode 112. The detection electrode 111 and driving electrode 112 of the electrostatic sensor 110M are placed in the vicinity of the LED 130. The driving electrode 112 is disposed opposite to the manipulation surface 101 with respect to the detection electrode 111. The mutual-capacitance driving unit 116, which is connected to the driving electrode 112, outputs an alternating-current voltage for use for driving.

A parasitic capacitance Cf is generated between the fingertip FT and the detection electrode 111 as in FIG. 2. Since the input device 100M is of a mutual capacitance type, it is considered that only the parasitic capacitance Cf is changed due to the proximity of the fingertip FT.

It can also be considered that: a parasitic capacitance Cds is present between the detection electrode 111 and the driving electrode 112; a parasitic capacitance Cls is present between the detection electrode 111 and the circuit portion 105; a parasitic capacitance Cld is present between the driving electrode 112 and the circuit portion 105; and a parasitic capacitance Clg is present between the circuit portion 105 and ground.

With the input device 100M as described above, if the circuit portion 105 is considered to have a sufficiently low impedance, a capacitance Ctm1 (combined capacitance) of the detection electrode 111 with the LED 130 turned on can be calculated from equation (4) below.

$$Ctm1 = Cds \tag{4}$$

With the input device 100M, which is a modification of the embodiment, a capacitance Ctm2 (combined capacitance) of the detection electrode 111 with the LED 130 turned off can be calculated from equation (5) below with consideration given to the parasitic capacitance Clg and the capacitance Cx of the capacitor 160.

$$Ctm2 = Cds + Cld)/(Cld + Clg + Cx) \times (Cld \times Cls)/(Cld + Cls) \quad (5)$$

<Simulation Results Using Equation (5)>

Figure 6:
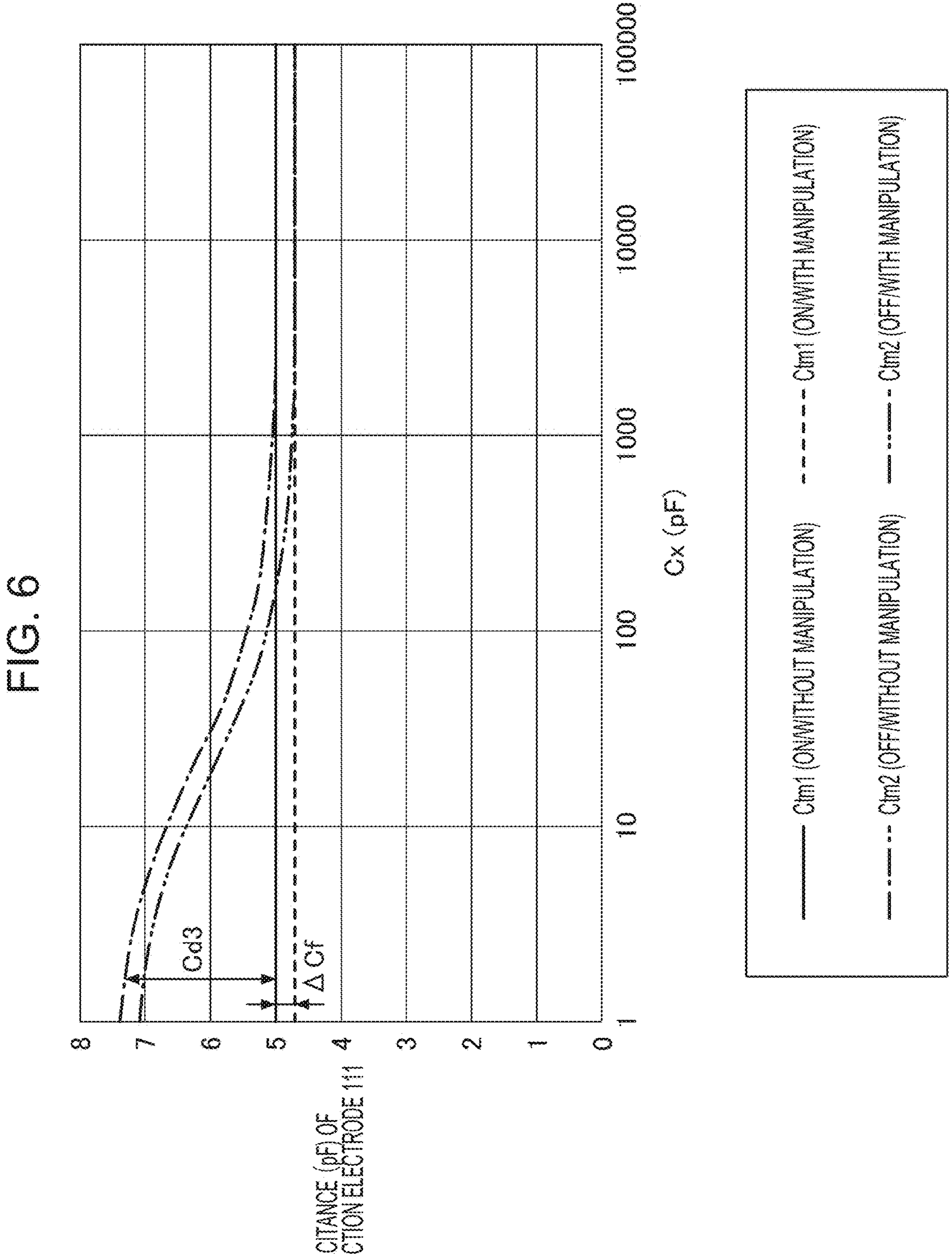
FIG. 6 illustrates calculation results for the capacitances of the detection electrode when the capacitance of the capacitor was changed in the input device, which is a modification of the embodiment.

FIG. 6 illustrates calculation results for the capacitances Ctm1 and Ctm2 of the detection electrode 111 when the capacitance Cx of the capacitor 160 was changed in the input device 100M, which is a modification of the embodiment. In FIG. 6, the horizontal axis logarithmically represents the capacitance Cx (in pF) of the capacitor 160 and the vertical axis represents the capacitance Ctm1 or Ctm2 (in pF) of the detection electrode 111.

In the simulation, the parasitic capacitance Cds between the detection electrode 111 and the driving electrode 112 was set to 5 pF. Also, the parasitic capacitance Cld between the driving electrode 112 and the circuit portion 105 was set to 10 pF; the parasitic capacitance Cls between the detection electrode 111 and the circuit portion 105 was set to 10 pF; and the parasitic capacitance Clg between the circuit portion 105 and ground was set to 10 pF. When the fingertip FT was in contact with the manipulation surface 101, the amount ΔCf of change in the parasitic capacitance Cds from when the fingertip FT was not in contact with the manipulation surface 101 was set to −0.3 pF.

In FIG. 6, in which the LED 130 was turned on, the solid line indicates the capacitance Ctm1 (ON/without a manipulation) of the detection electrode 111 in a state in which no manipulation was performed with the fingertip FT; and the dashed line indicates the capacitance Ctm1 (ON/with a manipulation) of the detection electrode 111 in a state in which the fingertip FT was in contact with the manipulation surface 101. With the LED 130 turned off, the dash-dot line indicates the capacitance Ctm2 (OFF/without a manipulation) of the detection electrode 111 in a state in which no manipulation was performed with the fingertip FT; and the dash-dot-dot line indicates the capacitance Ctm2 (OFF/with a manipulation) of the detection electrode 111 in a state in which the fingertip FT was in contact with the manipulation surface 101.

As illustrated in FIG. 6, when the capacitance Ctm1 (ON/without a manipulation) and the capacitance Ctm1 (ON/with a manipulation) were compared with each other, the capacitance Ctm1 (ON/with a manipulation) was lowered by the amount ΔCf (−0.3 pF) of change in the parasitic capacitance Cds due to the fingertip FT. Similarly, when the capacitance Ctm2 (OFF/without a manipulation) and the capacitance Ctm2 (OFF/with a manipulation) were compared with each other, the capacitance Ctm2 OFF/with a manipulation) was lowered by the amount ΔCf of change in the parasitic capacitance Cds due to the fingertip FT.

When the capacitance Ctm1 (ON/without a manipulation) and the capacitance Ctm2 (OFF/without a manipulation) were compared with each other, the tendency was found that as the capacitance Cx of the capacitor 160 was increased, the capacitance Ctm2 (OFF/without a manipulation) was lowered and the difference between the capacitance Ctm1 (ON/without a manipulation) and the capacitance Ctm2 (OFF/without a manipulation) was reduced. In particular, when the capacitance Cx of the capacitor 160 became 500 pF or more, the capacitance Ctm1 (ON/without a manipulation) and capacitance Ctm2 (OFF/without a manipulation) became substantially the same. This represents that in a state in which a manipulation with the fingertip FT is not performed, no variation occurs in the capacitance of the detection electrode 111 between the on and off states of the LED 130. When the capacitance Cx of the capacitor 160 has a very small value such as 1 pF, the difference Cd3 between the capacitance Ctm1 (ON/without a manipulation) and the capacitance Ctm2 (OFF/without a manipulation) is the difference in the capacitance of the detection electrode 111 between the on and off states of the LED 130.

When the capacitance Ctm1 (ON/with a manipulation) and the capacitance Ctm2 (OFF/with a manipulation) were compared with each other, the tendency was found that as the capacitance Cx of the capacitor 160 was increased, the capacitance Ctm2 (OFF/without a manipulation) was lowered and the difference between the capacitance Ctm1 (ON/with a manipulation) and the capacitance Ctm2 (OFF/with a manipulation) was reduced. In particular, when the capacitance Cx of the capacitor 160 became 500 pF or more, the capacitance Ctm1 (ON/with a manipulation) and capacitance Ctm2 (OFF/with a manipulation) became substantially the same. This represents that in a state in which the fingertip FT is in contact with the manipulation surface 101, no variation occurs in the capacitance of the detection electrode 111 between the on and off states of the LED 130. When the capacitance Cx is 500 pF, it is equivalent to 50 times the parasitic capacitance Cls (10 pF) between the detection electrode 111 and the circuit portion 105.

As described above, a variation in the capacitance of the detection electrode 111 between the on and off states of the LED 130 is suppressed both in a state in which a manipulation with the fingertip FT is not performed and in a state in which the fingertip FT is in contact with the manipulation surface 101. Therefore, it is considered that the same is similarly true even when a hover manipulation, in which the fingertip FT is not in contact with the manipulation surface 101, is performed.

Although details will be omitted here, with a comparative input device, which is a modification for use for comparison and in which the capacitor 160 is eliminated from the input device 100M in the modification of the embodiment, when the LED 130 is turned off, the capacitance Cx of the capacitor 160 is 0 pF in equation (5) for use for the capacitance of the detection electrode 111 with the LED 130 turned off, so it is considered that a variation occurs in the capacitance of the detection electrode 111 between the on and off states of the LED 130.

<Effects>

The input device 100M includes: the LED 130; the MOSFET 140 connected in series with the LED 130, the MOSFET 140 switching the LED 130 between the on and off states; and the electrostatic sensor 110M having the detection electrode 111 capacitively coupled to the circuit portion 105 disposed between the LED 130 and the MOSFET 140; and the capacitor 160 having the first terminal 161 connected to the circuit portion 105 and the second terminal 162 connected to ground. When the capacitor 160 is connected between ground and the cathode of the LED 130, it is possible for the input device 100M to suppress a variation in the capacitance of the detection electrode 111 between the on and off states of the LED 130.

Therefore, it is possible to provide the input device 100M in which the influence of the light emission state of the LED 130 on the detection capacity of the electrostatic sensor 110 is suppressed. Besides this effect, the input device 100M has effects similar to effects of the input device 100 indicated in FIGS. 1 to 3.

This completes the description of the input device in an exemplary embodiment of the present disclosure. However, the present disclosure is not limited to specifically disclosed embodiments. Various variations and modifications are possible without departing from the scope of the claims.

What is claimed is:

1. An input device comprising:

a light-emitting diode;

a switching element connected in series with the light-emitting diode, the switching element switching the light-emitting diode between on and off states;

a circuit portion connected in series between the light-emitting diode and the switching element;

an electrostatic sensor having a detection electrode capacitively coupled to the circuit portion; and a capacitor having a first terminal connected to the circuit portion and a second terminal connected to a fixed potential point.

2. The input device according to claim 1, wherein the switching element is a metal oxide semiconductor field-effect transistor.

3. The input device according to claim 1, wherein a capacitance of the capacitor is 50 times or more greater than a capacitance between the detection electrode and the circuit portion.

4. The input device according to claim 1, wherein:

the light-emitting diode has an anode connected to a power supply, and a cathode connected to the switching element through the circuit portion, while the capacitor is connected to the cathode of the light-emitting diode through the circuit portion, and the switching element is connected to the fixed potential point; or the light-emitting diode has the anode connected to the switching element through the circuit portion, and the cathode connected to the fixed potential point, while the capacitor is connected to the anode of the light-emitting diode through the circuit portion, and the switching element is connected to the power supply.

5. The input device according to claim 1, wherein the circuit portion has a first impedance when the switching element is in the on state and a second impedance when the switching element is in the off state, and wherein a capacitance of the capacitor is set such that the first impedance and the second impedance are substantially the same.

* * * * *